United States Patent
Kim et al.

(10) Patent No.: US 6,814,835 B2
(45) Date of Patent: Nov. 9, 2004

(54) APPARATUS AND METHOD FOR SUPPLYING CHEMICALS IN CHEMICAL MECHANICAL POLISHING SYSTEMS

(75) Inventors: Seung-un Kim, Kyunggi-do (KR); Seung-ki Chae, Seoul (KR); Je-Gu Lee, Yongin-shi (KR); Sue-Ryeon Kim, Kyunggi-do (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 138 days.

(21) Appl. No.: 10/084,198

(22) Filed: Feb. 28, 2002

(65) Prior Publication Data
US 2003/0089456 A1 May 15, 2003

(30) Foreign Application Priority Data
Nov. 12, 2001 (KR) ........................................ 2001-70139

(51) Int. Cl.[7] .............................. C23F 1/02; B01F 15/02
(52) U.S. Cl. ...................... 156/345.18; 137/47; 451/64; 216/38
(58) Field of Search ..................... 156/345.12, 345.13, 156/345.18; 134/1.3; 451/66; 216/38, 84; 137/47

(56) References Cited

U.S. PATENT DOCUMENTS

| | | | |
|---|---|---|---|
| 4,042,444 A | * | 8/1977 | Snyder ................... 156/345.15 |
| 4,805,348 A | | 2/1989 | Arai et al. |
| 5,099,614 A | | 3/1992 | Arai et al. |
| 5,329,732 A | | 7/1994 | Karlsrud et al. |
| 5,498,196 A | | 3/1996 | Karlsrud et al. |
| 5,498,199 A | | 3/1996 | Karlsrud et al. |
| 5,674,410 A | * | 10/1997 | Nakajima et al. ............. 216/92 |
| 6,001,215 A | * | 12/1999 | Ban ...................... 156/345.15 |
| 6,319,099 B1 | | 11/2001 | Tanoue et al. |

FOREIGN PATENT DOCUMENTS

| | | |
|---|---|---|
| JP | 2000-158339 | 6/2000 |
| KR | 2000-59169 | 10/2000 |

* cited by examiner

*Primary Examiner*—Gregory Mills
*Assistant Examiner*—Sylvia R. MacArthur
(74) *Attorney, Agent, or Firm*—Lee & Sterba, P.C.

(57) ABSTRACT

An apparatus for supplying chemicals in a chemical mechanical polishing (CMP) process includes a plurality of chemical solution supply sources for supplying different chemical solutions in a pump-less manner by using a pressure applied at the chemical solution supply sources, each supply source having an associated feed line, re-circulating line, and means for measuring and controlling flow rates of the chemical solutions supplied through the feed lines. The chemical solutions are delivered via a plurality of delivery lines to a mixer, thereby providing a mixed chemical solution to a chemical injection part of a polishing apparatus. Each means for measuring and controlling flow rates is mounted in the feed lines.

14 Claims, 5 Drawing Sheets

APPARATUS AND METHOD FOR SUPPLYING CHEMICALS IN CHEMICAL MECHANICAL POLISHING SYSTEMS

BACKGROUND OF THE INVENTION

1. Field of the Invention

The present invention generally relates to a chemical mechanical polishing (CMP) system and, more particularly, to a chemical supply apparatus and method in the CMP system.

2. Background of the Invention

In the manufacturing of high-density integrated circuits, effective device isolation typically requires a global planarization process step in order to implement multilevel interconnections. A chemical mechanical polishing (CMP) technique is an effective way to achieve such planarization. Such polishing methods are well known to those skilled in the art and include the steps of closely attaching one side of a wafer to a carrier or a flat surface of a chuck and pressurizing the other side of the wafer toward a flat polishing surface.

During CMP processes, however, micro-scratches are created on a semiconductor wafer surface. These micro-scratches may cause degradation of product quality and yield. The major causes of the micro-scratches are the intrinsic characteristics of a slurry supply apparatus and a characteristic change in a slurry resulting from shear stresses generated in the CMP system.

A slurry supply apparatus in a conventional CMP system uses peristaltic pumps in order to feed polishing chemicals onto a semiconductor wafer.

FIG. 1 illustrates a cross-sectional view of a peristaltic pump 400 used in a slurry supply apparatus in a conventional CMP system. Slurry is supplied through a flexible tube 410. The slurry stays in the flexible tube 410 and makes no contact with any part of the peristaltic pump 400. One end of the flexible tube 410 is connected to an input part of the peristaltic pump 400, and the other end is connected to an output part of the peripheral pump 400. Because the flexible tube 410 is abraded by repeated shrinkage and extension, the peristaltic pump 400 suffers from a danger of slurry leakage due to degradations, such as cracking or breakage, in the flexible tube 410 inside the peristaltic pump 400. In order to reduce this danger, the flexible tube 410 is frequently exchanged with a new flexible tube.

Another drawback with conventional CMP systems is that pressures generated while driving the peristaltic pump 400 cakes particles in the slurry to clog a pipe or the flexible tube 410. Moreover, grains produced by contaminants or slurry caked by tube abrasion may be supplied onto a wafer to cause process defects.

As described above, in a slurry supply apparatus using the peristaltic pump 400, a flexible tube is abraded to cause tube failure, and frequent tube exchange lowers a system's operating rate and increases the cost of operation. Moreover, an accuracy of the CMP process is lowered due to the use of the peristaltic pump 410.

Therefore, a current CMP process trend is to use chemical additives to form mixed slurries (e.g., ceria slurry, alumina slurry, etc.). Unfortunately, the chemical additive mixed slurry or slurry using a chemical element without a polishing element results in a settling phenomenon or a particle coagulation phenomenon that becomes more severe with the lapse of time than in the case with silica slurry. Since most current slurry supply apparatuses have a supply-following-mixture structure, they are not suitable for supplying the chemical additive mixed slurry.

SUMMARY OF THE INVENTION

A feature of an embodiment of the present invention is to provide a chemical supply apparatus and method in a semiconductor manufacturing process, using a self-supply pressure generated during chemical supply without a pump for forcibly supplying a chemical.

Another feature of an embodiment of the present invention is to provide a chemical supply apparatus and method in a semiconductor manufacturing process, that enables a chemical additive mixed slurry to suppress a settling phenomenon or a coagulation phenomenon that occurs with the lapse of time.

According to an aspect of the present invention, a chemical supply apparatus supplies a constant amount of chemical to a chemical injection part using a pressure of a pump-less chemical supply source. Means for measuring and controlling is mounted in a feed line to measure and control a flow rate of the supplied chemical in a proportional integral derivative (PID) automatic control manner.

In a preferred embodiment, the feed line further comprises a recycle line for preventing coagulation of the chemical and a branch line connected to the recycle line. The recycle line is preferably connected to the chemical supply source, and the branch line is connected to the chemical injection part via a measuring/controlling means. The measuring/controlling means comprises a flow rate control valve, a detector for detecting the flow rate of a chemical solution and generating flow rate data signals, and a controller for receiving the flow rate data signals and comparing the flow rate data signals with a reference flow rate data signal in order to output a control signal for controlling a degree of opening the flow rate control valve. The detector is mounted in or upon the feed line of the flow rate control valve According to a second embodiment of the present invention, an apparatus for supplying chemicals to a chemical injection part in a semiconductor manufacturing process comprises a plurality of chemical supply sources, each chemical supply source containing a different chemical solution, and a plurality of associated feed lines. The chemical solutions are preferably injected from the chemical supply sources to the chemical injection part using a pressure at the chemical supply sources. Flow is controlled using a means for measuring/controlling flow rates of the chemical solutions supplied to the chemical injection part. The measuring/controlling means may be mounted in or upon each of the feed lines.

In the second embodiment, each of the chemical solution feed lines comprises a recycle line for preventing coagulation of the chemical solution and a branch line branching from the recycle line. The recycle line is connected to the chemical supply source, and the branch line is connected to the chemical injection part.

A chemical supply method using the chemical supply apparatus according to the second embodiment of the present invention comprises the steps of providing a pressure to a plurality of chemical supply sources, respectively carrying chemical solutions from the chemical supply sources to a plurality of feed lines using the pressure, respectively measuring/controlling flow rates of the chemical solutions carried through the feed lines, and mixing the measured/controlled chemical solutions just before being supplied to the chemical injection part.

In the embodiments, the step of measuring/controlling the flow rates comprises the steps of detecting a flow rate of a chemical solution flowing into the feed line, receiving a data signal corresponding to the detected flow rate and comparing the data signal with a reference flow rate data signal in order to output a control signal for controlling a degree of opening a flow rate control valve in order to control the flow rate of the chemical solution.

These and other features of the present invention will be readily apparent to those of ordinary skill in the art upon review of the detailed description that follows.

DESCRIPTION OF THE PREFERRED EMBODIMENT

Korean Patent Application No. 2001-70139, entitled DEVICE FOR SUPPLYING CHEMICAL TO SLURRY MECHNICAL POLISHING APPARATUS AND METHOD THEREOF, filed on Nov. 12, 2001, is incorporated by reference herein in its entirety.

Figure 1:
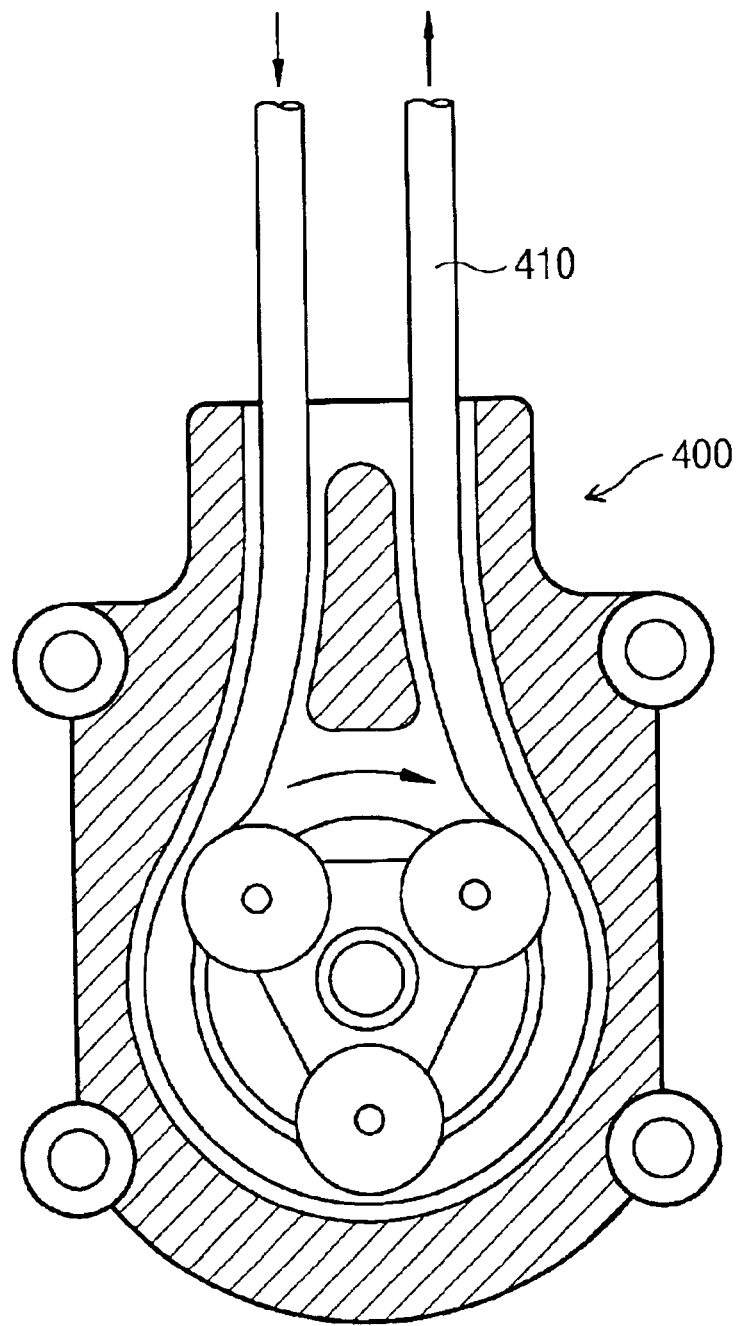
FIG. 1 illustrates a cross-sectional view of a polishing solution carry type metering pump that is generally used in a conventional CMP system.
Figure 2:
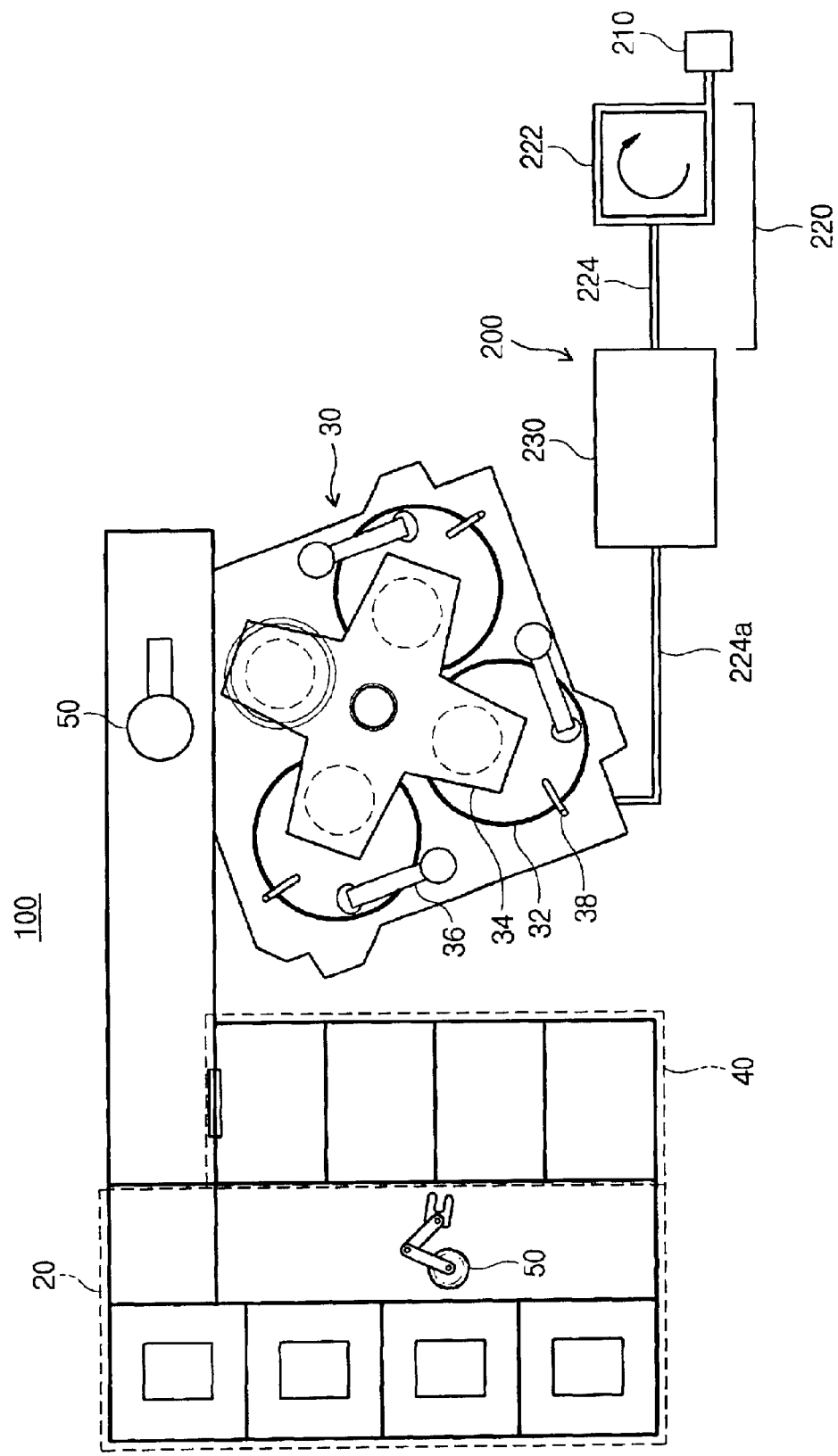
FIG. 2 illustrates a top plan view of an exemplary CMP system with a chemical supply apparatus according to the present invention.
Figure 3:
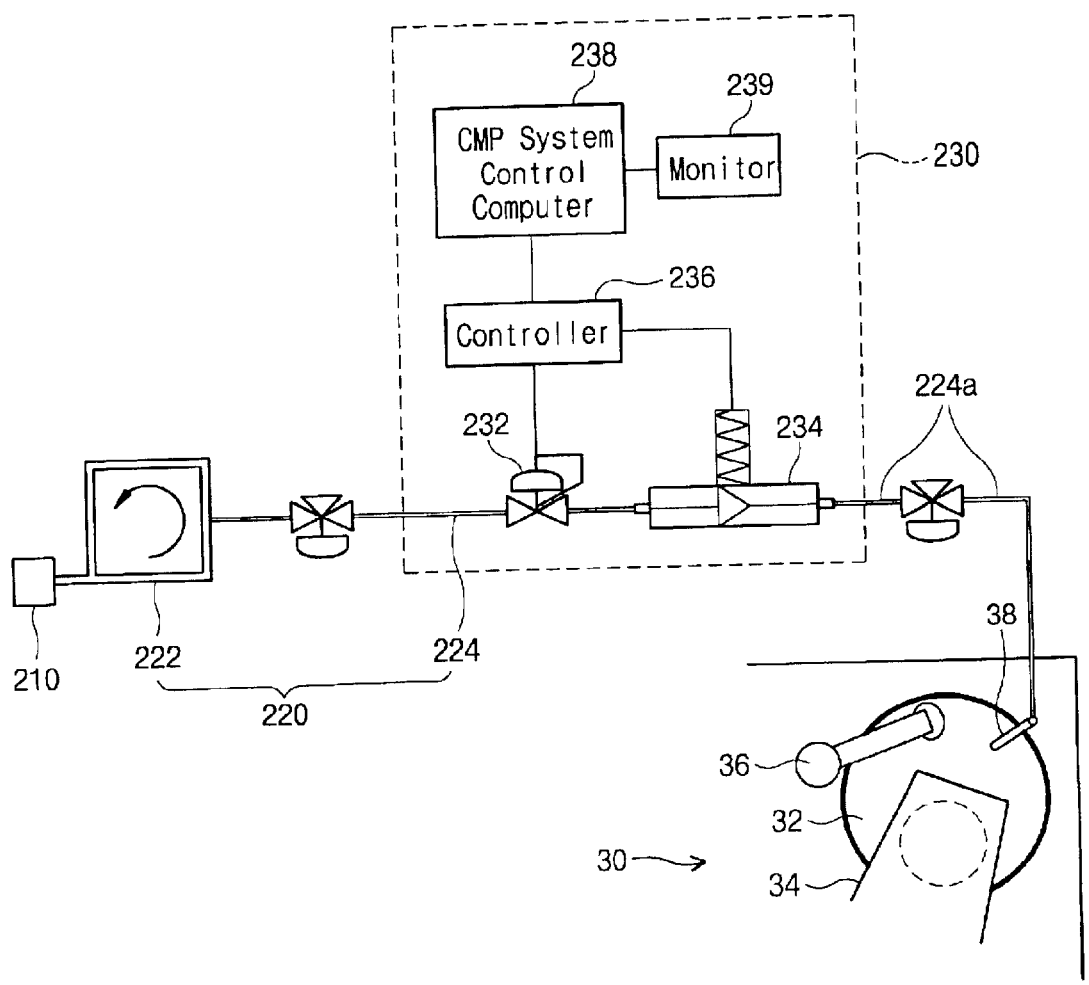
FIG. 3 illustrates a block diagram showing a detailed example of a chemical supply apparatus according to a first embodiment of the present invention.

FIGS. 2 and 3 illustrate a top view and a block diagram, respectively, of an exemplary CMP system having a chemical supply apparatus according to a first embodiment of the present invention. In the CMP system of FIG. 2, a layer of a wafer to be planarized is polished using chemical and mechanical actions.

As shown in FIG. 2, the CMP system 100 includes a wafer carrying unit 20 for loading/unloading a wafer on a cassette, a polishing station 30 having a plurality of rotate-able turntables 32 and a polishing head assembly 34, a cleaner station 40 for cleaning contaminants that remain after a polishing process, transfer robots 50 for sequentially transferring each of a plurality of wafers, and a slurry supply device 200. A polishing pad is closely attached to the turntable 32 on a side toward the wafer to be polished.

The turntable 32 is coupled to a turntable rotating mechanism (not shown) that rotates the turntable 32 at an exemplary 50–80 rpm in an ideal polishing condition, although a higher rotation speed may be used. Polishing station 30 preferably has a conventional pad-conditioning means 36 and a slurry injection nozzle 38 for injecting a slurry onto a surface of the polishing pad. The polishing station 30 and the polishing head assembly 34 are well known to those skilled in the art and will not be explained in further detail.

The slurry preferably contains a reaction reagent (e.g., de-ionized wafer for oxidation polishing), friction particles (e.g., silicon dioxide for oxidation polishing), and a chemical additive or reaction catalyst (e.g., potassium hydroxide for oxidation polishing). The slurry is received from the slurry supply device 200. As shown in FIG. 3, a chemical supply device 200 according to the present invention comprises a chemical supply source 210, a feed line 220, and a flow rate control unit 230 for regulating the flow to polishing station 30.

Chemical supply source 210 supplies a chemical solution into the feed line 220. That is, the chemical solution flows into the feed line 220 by means of a chemical discharge force (pressure), which may be generated by forcible gas injection. The chemical solution may be a fully-mixed slurry or a chemical component of a slurry to allow the flexibility of mixing the slurry at a node closer to slurry injection nozzle 38 to aid in a de-coagulation of particulates as will be detailed below in an alternate embodiment.

The feed line 220 has a recycle line 222 and a branch line 224. The recycle line 222 is coupled to the chemical supply source 210 and prevents coagulation of the chemical solution by continuously re-circulating the chemical solution until applied at the point of use. Branch line 224 branches from the recycle line 222, and is coupled to flow rate control unit 230 and thence to slurry injection nozzle 38 of polishing station 30 via a delivery branch line 224a. A filter (not shown) for filtering thick particles contained in the chemical solution may be included in feed line 220.

Flow rate control unit 230 further comprises a flow rate control valve 232, a flow rate detector 234, and a controller 236. Flow rate detector 234 measures a flow rate of the chemical solution that is supplied to slurry injection nozzle 38 through flow rate control valve 232. An electrical signal corresponding to a flow rate of the measured chemical solution is applied to controller 236. According to the first embodiment of the present invention, flow rate detector 234 may be any measuring device, including non-contact measurement devices, e.g., sound, light, etc., and contact measurement devices, e.g., chemical contacting types of flow detectors. Controller 236 analyzes flow rate data provided from the flow rate detector 234, and then determines whether the flow rate exceeds a permissible error range. When the flow rate exceeds the permissible error range, a control signal for controlling a degree of opening the flow rate control valve 232 is outputted in real time. Thus, flow rate control valve 232 is automatically controlled to constantly maintain a predetermined amount of chemical solution at slurry injection nozzle 38. Controller 236 may also generate an alarm, stop the CMP process, or take other suitable actions. For example, controller 236 feeds back the flow rate and preferably employs a proportional integral derivative (PID) automatic control scheme.

Controller 236 may also include a CMP system control computer 238 for controlling general operations of the entire CMP process. Control computer 238 may be connected to a monitor 239 that enables an operator to view a flow rate control operation.

As described above, because a chemical solution is preferably supplied using a pressure of a pumpless chemical supply source, a pump or the like is not mounted in the feed lines. Instead, gas injection is used to introduce a chemical solution, and re-circulation of the chemical solution in the re-circulation lines is made possible by the gas injection without the use of a pump. This makes it possible to suppress the formation of scratches, an occurrence of a coagulation phenomenon, or the introduction or creation of contaminants.

According to the present invention, slurry supply device 200 may include a plurality of chemical supply sources 210. It will be appreciated that a slurry supply device according to the present invention may include combinations of a plurality of chemical supply sources, a plurality of feed lines, and a plurality of flow rate control units. Although it is preferable that a single controller 236 control the general operations of a single flow rate control valve 232, a plurality of controllers may be used. Alternatively, a single controller 236 may control multiple flow rate control valves 232.

Figure 4:
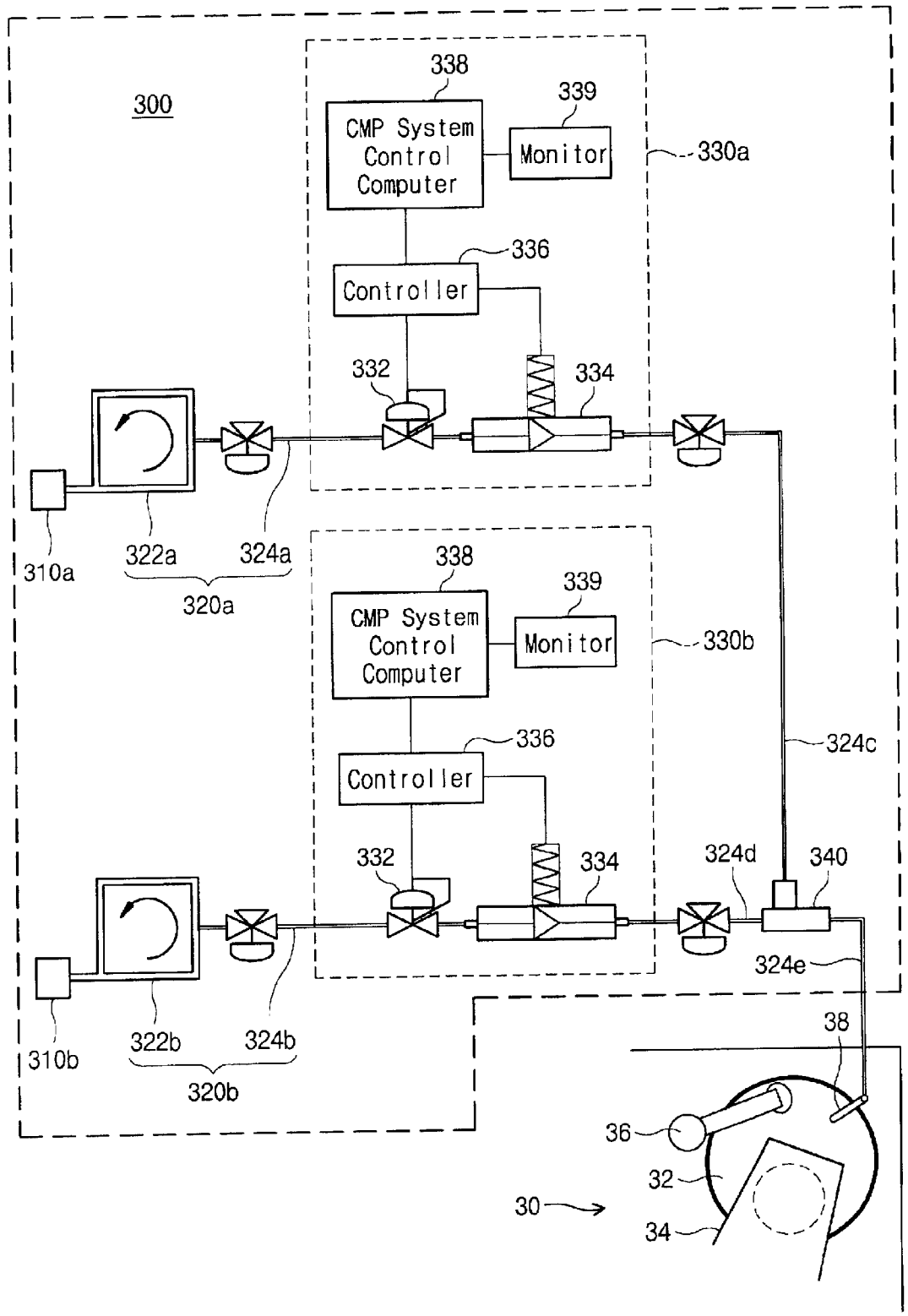
FIG. 4 illustrates a block diagram showing a detailed example of a chemical supply apparatus according to a second embodiment of the present invention.

FIG. 4 illustrates an exemplary slurry supply device according to a second embodiment of the present invention. As shown in FIG. 4, a slurry supply device 300 can mix and supply a plurality of different kinds of chemicals. The slurry supply device 300 has, respectively, first and second chemical supply sources 310a and 310b, first and second feed lines 320a and 320b, first and second flow rate control units 330a and 330b, first and second delivery branch lines 324c and 324d, and a mixer 340. Each of the chemical supply sources 310a and 310b, the recycle lines 322a and 322b, the feed lines 320a and 320b with branch lines 324a and 324b, and the flow rate control units 330a and 330b, with associated valves 332, sensors 334, controllers 336, computers 338, and monitors 339 have the same structure and function as similar elements in chemical supply device 200 according to the first embodiment. Therefore, they will not be explained in further detail.

According to the second embodiment, a delivery branch line 324d of the second feed line 320b and second control unit 330b is coupled to delivery branch line 324c of the first feed line 320a. First control unit 330a with mixer 340 is installed as the coupling part in order to mix first and second chemical solutions with each other just before supplying the first and second chemical solutions to slurry injection nozzle 38 of polishing station 30 via delivery branch line 324e. The first and second chemical solutions may be a polishing agent and a chemical additive, respectively.

In slurry supply device 300, the first chemical supply source 310a preferably contains a polishing agent (friction particles), and the second chemical supply source 310b preferably contains a chemical additive (or chemical reaction catalyst) to be mixed with the polishing agent. The first and second feed lines 320a and 320b, respectively, are coupled to first and second chemical supply sources 310a and 310b, respectively. The relative amounts of the polishing agent and the chemical additive are controlled by flow rate control units 330a and 330b mounted on the branch lines 324a and 324b, respectively. Thereafter, the polishing agent and the chemical additive are mixed with each other in mixer 340 that is preferably close to slurry injection nozzle 38. For example, a mixing ratio of the polishing agent to the chemical additive is preferably 1:2. Controlling the mixing ratio can be accomplished by adjusting a setting value.

Figure 5:
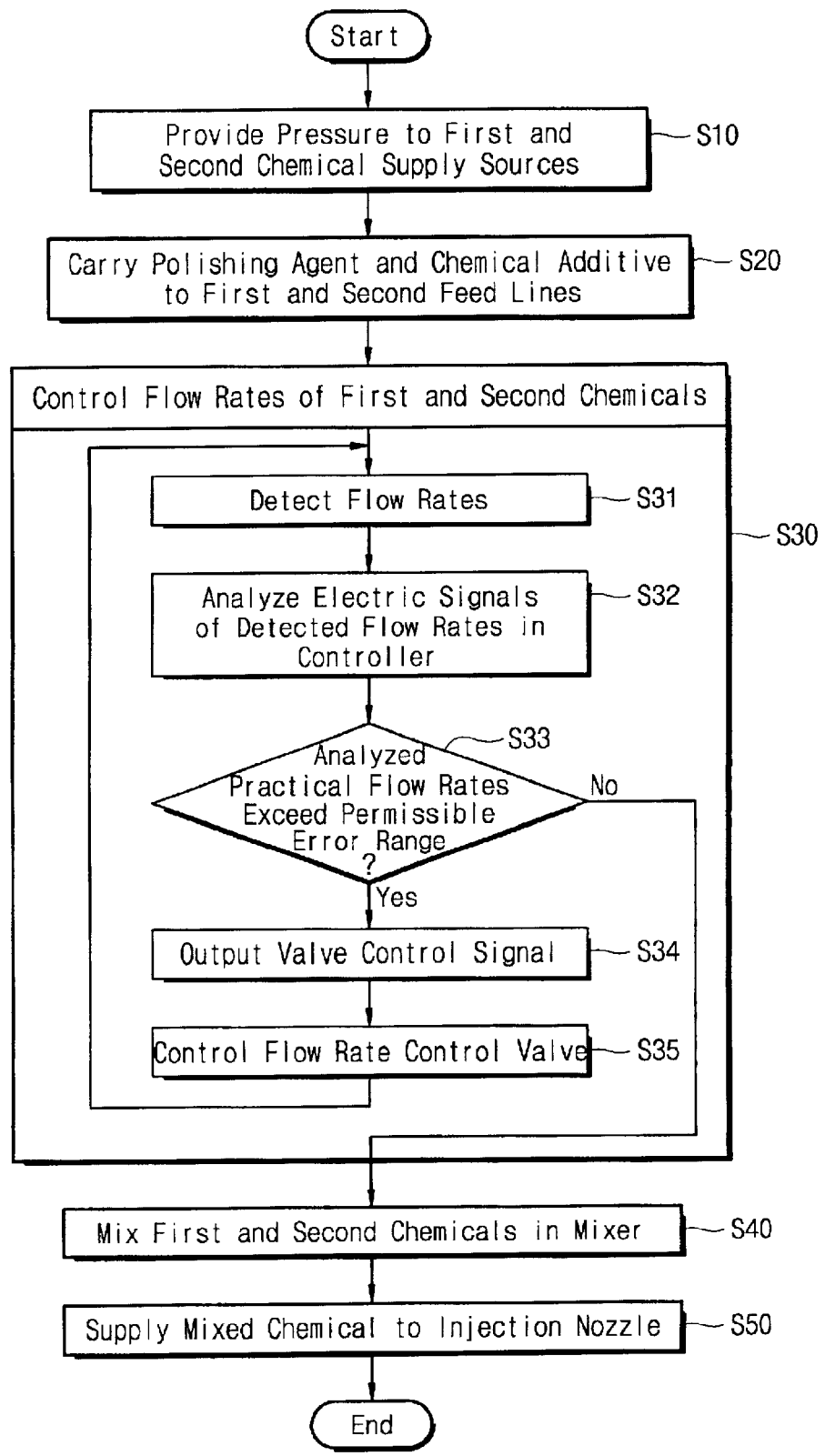
FIG. 5 illustrates a flowchart showing chemical supply steps according to the present invention.

A method for supplying slurry according to the present invention is described below with reference to a flowchart shown in FIG. 5 for the second embodiment shown in FIG. 4. Although the method described below relates to the second embodiment, the steps may be used and applied by one skilled in the art to the processes of the first embodiment.

A pressure is provided to first and second chemical supply sources 310a and 310b, respectively, in step S10. A polishing agent and a chemical additive are carried from the first and second chemical supply sources 310a and 310b to feed lines 310a and 320b, respectively, by the pressure in step S20. Flow rates of the polishing agent and chemical additive are controlled in flow rate control units 330a and 330b, respectively, in step S30.

The flow step "S30" is described in detail as follows. The flow rates are detected in flow rate detectors 334, respectively, in step S31. Electric signals of the detected flow rates are analyzed in controllers 336, respectively, in step S32. Determination is made as to whether the analyzed flow rates exceed a permissible error range in step S33. If flow rates exceed the permissible error range, a control signal for controlling a degree of opening a flow rate control valve 332 in real time is outputted in step S34. The flow rate control valve 332 is controlled by the control signal from the controller 336 in step S35. If the flow rate is not exceeded, the first and second chemicals are mixed with each other in a mixer 340 in step S40. The analyzed flow rates may be outputted through a monitor 339. Just before supplying the controlled polishing agent and chemical additive to the slurry injection nozzle 38, they are mixed with each other in mixer 340. A mixed chemical is supplied to chemical injection nozzle 38 in step S50.

According to the second embodiment, slurry supply device 300 has a supply-following-mixture structure. That is, just before supplying different chemicals to the slurry injection nozzle, they are mixed with each other in the mixer 340. Therefore, slurry supply device 300 is suitable for supplying chemical additive-mixed slurry (e.g., ceria slurry, alumina slurry, etc.) or a slurry using a chemical element without a polishing element. In addition, slurry supply device 300 is used to overcome a settling phenomenon or a coagulation phenomenon that occurs in the use of silica slurry.

A preferred embodiment of the present invention has been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the invention as set forth in the following claims

What is claimed is:

1. An apparatus for supplying a chemical solution to a chemical injection part in a semiconductor manufacturing process, comprising:
    a chemical solution supply source;
    a feed line in which the chemical solution is supplied from the chemical solution supply source to the chemical solution injection part using a pressure of the chemical solution supply source; and
    means for measuring/controlling a flow rate of the supplied chemical solution, the measuring/controlling means being mounted in the feed line,
    wherein the feed line comprises:
        a recycle line for preventing coagulation of the chemical solution, the recycle line being connected to the chemical solution supply source; and
        a branch line branching from the recycle line, the branch line being connected to the chemical solution injection part, and
    wherein the means for measuring/controlling the flow rate of the supplied chemical solution comprises:
        a flow rate control valve;
        a detector for detecting the flow rate of the chemical solution and generating a flow rate data signal, the detector being mounted in the feed line of the flow rate control valve; and
        a controller for receiving the flow rate data signal and comparing the flow rate data signal with a reference flow rate data signal in order to output a control signal for controlling a degree of opening the flow rate control valve.

2. An apparatus as claimed in claim 1, wherein the controller comprises a proportional integral derivative (PID) automatic controller.

3. An apparatus as claimed in claim 1, wherein the controller further comprises a display device for displaying the measured flow rate and an alarm device for warning an operator that the measured flow rate is different from a required flow rate.

4. An apparatus as claimed in claim 1, wherein the chemical injection part is included in a polishing apparatus having a rotate-able turntable and a polishing pad.

5. An apparatus as claimed in claim 1, wherein the chemical solution is a slurry comprising one or more from the group consisting of a reaction reagent, friction particles, and a chemical reaction catalyst.

6. An apparatus for supplying a chemical solution to a chemical injection part in a semiconductor manufacturing process, comprising:

a plurality of chemical solution supply sources, each source supplying a different chemical solution;

a plurality of feed lines into which the chemical solutions are injected from the chemical solution supply sources to the chemical injection part by a pressure of the chemical solution supply sources, each one of the plurality of feed lines having a recycle line for preventing coagulation of the chemical solution supply source, and having a branch line branching from the recycle line, the branch line being connected to an associated chemical solution injection part; and a means for measuring/controlling flow rates of the chemical solutions supplied to the chemical solution injection part, the means for measuring/controlling flow rates being mounted in each of the feed lines.

7. An apparatus as claimed in claim 6, wherein the chemical solutions are mixed with each other just before being supplied to the chemical solution injection part.

8. An apparatus as claimed in claim 6, wherein the branch lines of each one of the plurality of feed lines are coupled by a coupling part to a single line just before supplying the chemical solutions to the chemical solution injection part, and wherein the coupling part is adjacent the chemical solution injection part.

9. An apparatus as claimed in claim 6, further comprising a mixer for mixing the chemical solutions with each other, the mixer being installed at the coupling part.

10. An apparatus as claimed in claim 6, wherein each one of the plurality of chemical solutions comprises one or more from the group consisting of a polishing agent, a chemical additive mixed with the polishing agent, and de-ionized (DI) water.

11. An apparatus as claimed in claim 6, wherein each of the measuring/controlling means comprises:

a flow rate control valve;

a detector for detecting the flow rate of the associated chemical solution, the detector being mounted in the feed line of the flow rate control valve; and a controller for receiving a flow rate data signal and comparing the flow rate data signal with reference flow rate data signal in order to output a control signal for controlling a degree of opening the flow rate control valve.

12. An apparatus as claimed in claim 11, wherein the controller comprises a proportional integral derivative (PID) automatic controller.

13. An apparatus as claimed in claim 11, wherein each one of the controllers further comprises a display device for displaying the measured flow rate and an alarm device for warning an operator that the measured flow rate is different from a required flow rate.

14. An apparatus as claimed in claim 6, wherein the chemical solution injection part is included in a polishing apparatus having a rotate-able turntable and a polishing pad.

* * * * *